United States Patent
Young et al.

(10) Patent No.: US 6,457,477 B1
(45) Date of Patent: Oct. 1, 2002

(54) METHOD OF CLEANING A COPPER/POROUS LOW-K DUAL DAMASCENE ETCH

(75) Inventors: Bao-Ru Young, I-Lan (TW); Li-Chih Chao, Tao-yuan (TW); Shwangming Jeng, Hsin-chiu (TW); Chi-Shiung Tsai, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 142 days.

(21) Appl. No.: 09/624,020

(22) Filed: Jul. 24, 2000

(51) Int. Cl.$^7$ .............................................. H01L 21/302
(52) U.S. Cl. .................. 134/1.2; 134/902; 216/49; 216/67; 438/710; 438/906; 438/963
(58) Field of Search ............................. 216/17, 18, 39, 216/49, 63, 67, 80; 438/700, 706, 710, 743, 744, 906, 963, 970; 134/1, 1.1, 1.2, 902

(56) References Cited

U.S. PATENT DOCUMENTS

| | | | |
|---|---|---|---|
| 5,946,589 A | * 8/1999 | Ng et al. | 438/586 |
| 6,006,763 A | * 12/1999 | Mori et al. | 134/1.1 |
| 6,006,764 A | * 12/1999 | Chu et al. | 134/1.2 |
| 6,313,042 B1 | * 11/2001 | Cohen et al. | 438/655 |

* cited by examiner

*Primary Examiner*—Randy Gulakowski
*Assistant Examiner*—J Smetana
(74) *Attorney, Agent, or Firm*—George O. Saile; Stephen B. Ackerman; Stephen G. Stanton

(57) ABSTRACT

A method of cleaning a low-k material etched opening, comprising the following steps. A semiconductor structure having an exposed device therein is provided. An etch stop layer is formed over the semiconductor structure and the exposed device. A layer of low-k material is formed over the etch stop layer semiconductor structure and device. A patterned layer of photoresist is formed over the low-k material layer. The patterned photoresist layer is used as a mask to etch low-k material layer is etched to form an opening exposing at least a portion of the etch stop layer over the device. The patterned photoresist layer is removed by a low temperature ashing process at a temperature from about 23 to 27° C., and more preferably about 25° C. (room temperature). The exposed portion of the etch stop layer over the device is removed to expose the underlying device by a low pressure, low bias etching process at a pressure from about 8 to 12 milli-Torr and a bias power from about 25 to 35 W. The exposed underlying device and the opening are cleaned by removing any remaining low pressure, low bias etch polymer and etch residue by a fully dry-type cleaning process using an $H_2He$ gas.

31 Claims, 3 Drawing Sheets

METHOD OF CLEANING A COPPER/POROUS LOW-K DUAL DAMASCENE ETCH

BACKGROUND OF THE INVENTION

After etching through a porous low-k material layer to form an opening exposing an underlying metal line, for example a copper line, the etched opening must be cleaned before filling the via with a conducting metal to form a metal interconnect. The opening may be, for example, a via opening, a trench opening, or a dual damascene opening.

The most common method of etching the low-k material involves depositing and patterning a photoresist layer over the low-k material. The patterned photoresist layer is used as a mask for the low-k material etch. The photoresist is removed by a high temperature ashing conducted at from about 35 to 45° C., and more preferably about 40° C.

In many cases, an etch stop layer, such as SiN, overlies the underlying metal line to signal the completion of etching of the low-k material and to protect the metal line. The opening is formed through the low-k material by conventional lithography and etching using the etch stop layer as a stop. This etch stop layer is first removed by etching, and then the opening is cleaned by a wet cleaning process to prepare for depositing a metal layer to fill the opening.

U.S. Pat. No. 5,946,589 to Ng et al. describes an in-situ photoresist removal and post clean ($H_2O$).

U.S. Pat. No. 6,006,764 to Chu et al. describes a 3 step PR strip.

SUMMARY OF THE INVENTION

Accordingly, it is an object of the present invention to provide a dry cleaning method for copper/porous low-k etches.

Another object of the present invention is to provide a copper/porous low-k etch cleaning method that prevents deterioration of the subsequent metallization process.

Other objects will appear hereinafter.

It has now been discovered that the above and other objects of the present invention may be accomplished in the following manner. Specifically, a semiconductor structure having an exposed device therein is provided. An etch stop layer is formed over the semiconductor structure and the exposed device. A layer of low-k material is formed over the etch stop layer semiconductor structure and device. A patterned layer of photoresist is formed over the low-k material layer. The patterned photoresist layer is used as a mask to etch low-k material layer is etched to form an opening exposing at least a portion of the etch stop layer over the device. The patterned photoresist layer is removed by a low temperature ashing process at a temperature from about 23 to 27° C. and more preferably about 25° C. (room temperature). The exposed portion of the etch stop layer over the device is removed to expose the underlying device by a low pressure, low bias etching process at a pressure from about 8 to 12 milli-Torr and a bias power from about 25 to 35 W. The exposed underlying device and the opening are cleaned by removing any remaining low pressure, low bias etch polymer and etch residue by a fully dry-type cleaning process using an $H_2He$ gas.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, etc. may be formed or accomplished by conventional methods known in the prior art.

Figure 1:
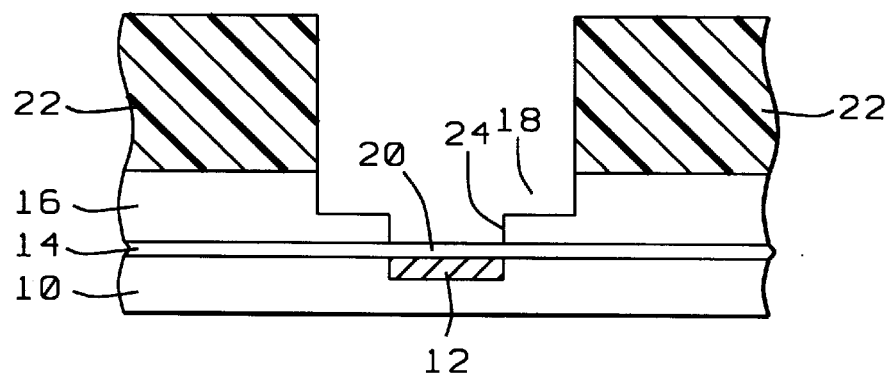
FIG. 1 schematically illustrates in cross-sectional representation a dual damascene opening common to a prior process known to the inventors and to the preferred embodiment of the present invention.

Accordingly as shown in FIG. 1 starting semiconductor structure 10 includes at least one exposed active device 12. Semiconductor structure 10 is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Active device 12 can represent a conductive line/interconnect in a dielectric layer. Active device 12 is preferably comprised of copper and may include a barrier layer such as Ta or TaN.

Etch stop layer 14 is formed over semiconductor structure 10 and active device 12.

Etch stop layer 14 may be formed from SiC, SiON, or $Si_3N_4$, and may preferably formed of silicon nitride ($Si_3N_4$ or just "SiN"). Etch stop layer 14 is preferably from about 450 to 550 Å thick.

Porous interlayer dielectric (ILD) layer 16 is formed over SiN etch stop layer 14.

ILD layer 16 may be formed from a low dielectric constant (low-k) material such as Black Diamond™, HSQ, or Coral™, and is preferably formed from silicon oxide ($SiO_2$). ILD layer 16 is preferably from about 8,000 to 12,000 Å thick, and more preferably from about 10,000 to 11,000 Å thick.

Opening 18 is formed through porous low-k ILD layer 16, using etch stop layer 14 as a stop, exposing the portion 20 of SiN etch stop layer 14 over active device 12.

Opening 18 may be a trench, a via, or, as shown in FIG. 1, a dual damascene opening formed by methods known in the prior art.

Opening 18 may be formed by forming and patterning photoresist (PR) layer 22 over ILD layer 16. Patterned PR layer 22 is then used as a mask to etch opening 18 through ILD layer 16.

Patterned PR layer 22 and portion 20 of SiN etch stop layer 14 are removed and opening 18 is filled with a conductive metal layer to form a dual damascene structure, for example. (See FIGS. 2–4)

EXISTING PROBLEM KNOWN TO THE INVENTORS

High Temperature Patterned Photoresist Layer 22 Ashing

The current method to remove photoresist (PR) layer 22 is by a high temperature ashing of PR layer 22. This high temperature ashing is conducted at from about 35 to 45° C., and more preferably about 40° C.

Figure 5:
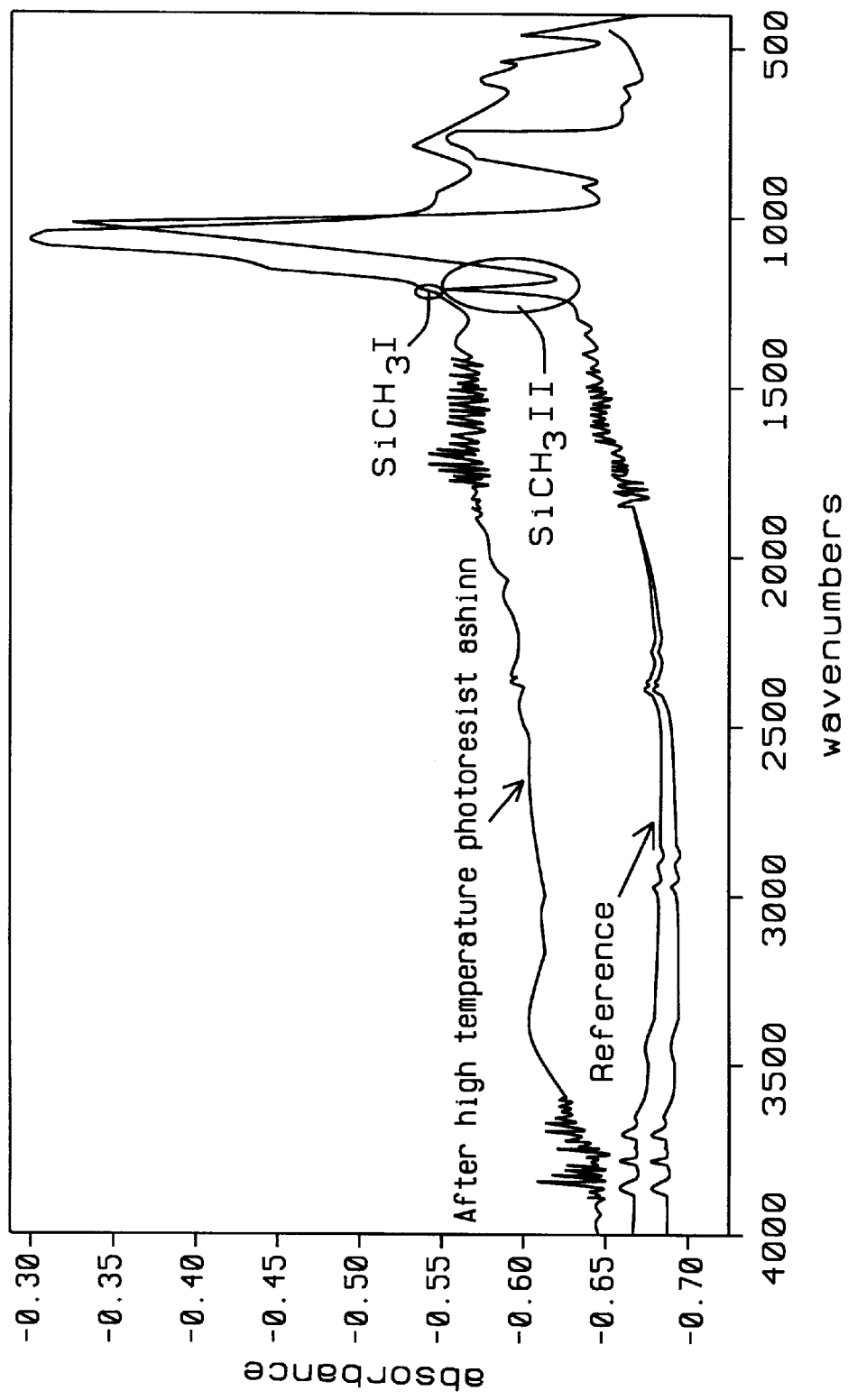
FIG. 5 is an FTIR spectograph of a low-k material before a high temperature photoresist ashing process aligned with an FTIR spectograph of a low-k material after a high temperature photoresist ashing process.

However, as shown in FIG. 5, this current high temperature ashing process damages low-k material layer 16 by destroying the integrity of a majority of the methyl-silane bonds (Si—$CH_3$) within low-k material layer 16. As indicated, the intensity of the Si—$CH_3$ peak II in the FTIR spectograph of the post-high temperature PR ashing is significantly reduced as compared to the Si—$CH_3$ peak I in the FTIR spectograph of the pre-high temperature PR ashing. The reduction of the Si—$CH_3$ bonds within low-k material 16 is detrimental because of high oxidation reactions during high temperature photoresist stripping process.

This high oxidation rate in the high temperature ashing increases the dielectric constant of the low-k material layer 16, weakens the structure of the low-k material layer 16, and degrades the performance/insulation of the metal dual damascene structure 28 formed thereafter in the opening 18 within the low-k material layer 16.

After PR layer 22 ashing, portion 20 of SiN etch stop layer 14 over active device 12 is etched and removed. Opening 18 is then cleaned to remove remnants of etched SiN layer portion 20. However, the current wet cleaning process used presents additional problems as noted below.

Current Wet Cleaning Process

The current wet cleaning process of opening 18 within porous low-k layer 15 permits trapping of solvent within the small pores of porous low-k layer 15. This risks deterioration of the following metallization process of forming a metal layer within opening 18, and of the reliability of the metal interconnect formed within opening 18 due to outgassing of the trapped solvent.

INVENTORS' PREFERRED EMBODIMENT OF THE PRESENT INVENTION

FIGS. 1 to 4 illustrate the method of the present invention which substitutes an insitu low temperature photoresist layer 22 ashing for the current high temperature photoresist layer 22 ashing, and a fully dry cleaning process of opening 18 for the current wet clean process of opening 18.

BRIEF SUMMARY OF THE INVENTION

The method of the present invention briefly consists of three key steps:

Step One: a low temperature photoresist ashing;

Step Two: a low operating pressure anisotropic etch of portion 20 of. SiN etch stop layer 14 applying bias power to maintain the vertical profile; and Step Three: removing the etch polymer/residue using $H_2$ based chemistry (with a He flow-through carrier).

Step One—Low Temperature Photoresist (PR) Ashing

Figure 2:
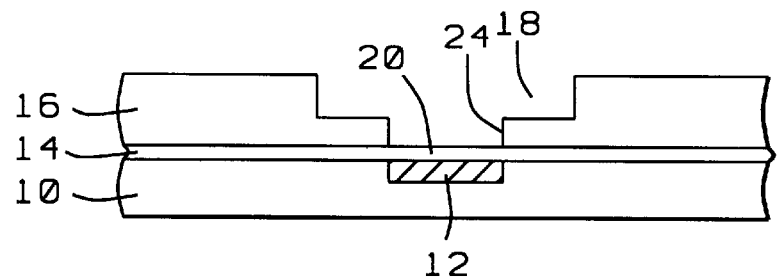
FIGS. 2 to 4 illustrate the remainder of the preferred embodiment of the present invention.

As shown in FIG. 2, and in Step One of the present invention, patterned photoresist layer 22 is removed by a low temperature ashing at the following parameters:

Temperature: from about 23 to 27° C., and more preferably about 25° C. (room temperature). (This compares to the current wet cleaning photoresist ashing temperature of from about 35 to 45° C., and more preferably about 40° C.);

Pressure: from about 8 to 12 milli-Torr (mT), and more preferably about 10 mT;

Inductive coupled plasma (ICP) Power: from about 450 to 550 watts (W), and more preferably about 500 W;

Bias Power: from about 80 to 120 W, and more preferably about 100 W;

Gas Flow: from about 25 to 35 sccm $O_2$, and more preferably about 30 sccm $O_2$;

Time: from about 80 to 100 seconds, and more preferably about 90 seconds; and

Tool: an inductive coupled plasma (ICP) tool such as a Mattson tool.

Step Two—Low Pressure Anisotropic Etch of SiN Layer Portion 20

Figure 3:
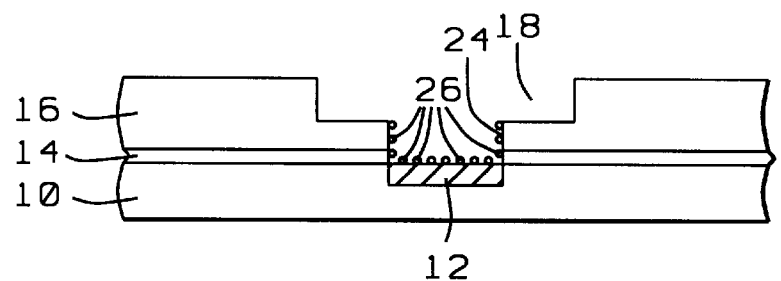

As shown in FIG. 3 and in Step Two of the present invention, a low operating pressure is used to anisotropically etch portion 20 of SiN etch stop layer 14 to ensure there is no undercut of stop layer 14 of low-k dielectric layer 16. To minimize sputtering of the underlying copper device 12, a very low bias power is used so that a minimal amount copper from copper device 12 is sputtered onto the via 18 sidewall 24. The low bias power also maintains the vertical profile of the remaining SiN layer 14.

The Step Two SiN layer portion 20 anisotropic etch is conducted at the following parameters:

Temperature: from about 23 to 27° C., and more preferably about 25° C. (room temperature);

Pressure: from about 8 to 12 milli-Torr (mT), and more preferably about 10 mT;

ICP Power: from about 450 to 550 watts (W), and more preferably about 500 W;

Bias Power: from about 25 to 35 W, and more preferably about 30 W;

Gas Flow: from about 8 to 12 sccm $O_2$ and from about 45 to 55 sccm $C_2F_6$, and more preferably about 10 sccm $O_2$ and about 50 sccm $C_2F_6$; and Time: from about 55 to 65 seconds, and more preferably about 60 seconds;

Tool: an inductive coupled plasma (ICP) tool such as a Mattson tool.

The Step Two anisotropic etch of etch stop layer portion 20 exposes at least a portion of copper device 12, with post etch polymer/residue 26 remaining on exposed copper device 12 and within opening 18.

Step Three—Removal of Etch Polymer/Residue 26

Figure 4:
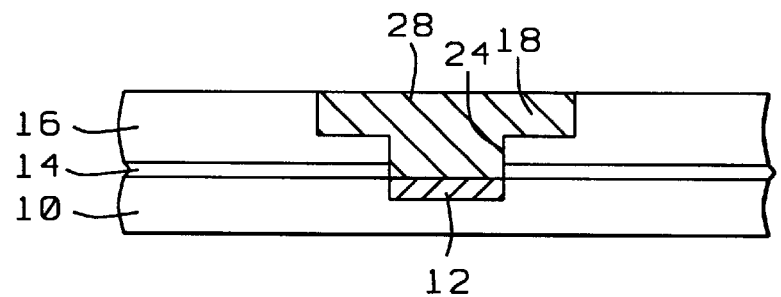

As shown in FIG. 4, and in Step Three of the present invention, post etch polymer/residue 26 is cleaned from exposed copper device 12 and sidewalls 24 of opening 18 using a fully dry hydrogen-based chemistry. The hydrogen-based chemistry removes the post etch polymer/residue compounds containing carbon, silicon, and fluoride. It can also reduce any copper oxide that may have formed on the copper device 12 surface during etch stop layer portion 20 removal of Step Two.

The Step Three dry cleaning process is conducted at the following parameters:

Temperature: from about 23 to 27° C., and more preferably about 25° C. (room temperature)

Pressure: from about 16 to 24 milli-Torr (mT), and more preferably about 20 mT;

ICP Power: from about 450 to 550 watts (W), and more preferably about 500 W;

Bias Power: from about 45 to 55 W, and more preferably about 50 W;

Gas Flow: from about 70 to 80 sccm $H_2He$ and more preferably about 75 sccm $H_2He$; with the ratio of $H_2$ within the He carrier gas being from about 1:10 to 1:11 $H_2$: He, and more preferably about 1:10 $H_2$: He;

Time: from about 25 to 35 seconds, and more preferably about 30 seconds; and

Tool: an inductive coupled plasma (ICP) tool such as a Mattson tool.

A planarized metal layer 28 may then be formed within opening 18 to form, for example as shown in FIG. 4, a dual damascene metal structure 28. Metal dual damascene structure 28 may be formed of aluminum or copper, and is preferably copper.

ADVANTAGES OF THE PRESENT INVENTION

Due to the conditions at which the method of the present invention is conducted, the integrity of the methyl-silane (Si—CH$_3$) bonds (as noted) are preserved within low-k material layer 16. This is evidenced in the FIG. 6 FTIR spectographs which are annotated "Reference," "After Step 1," "After Step 2," and "After Step 3" (in ascending order) for the respective processing steps of the present invention.

Figure 6:
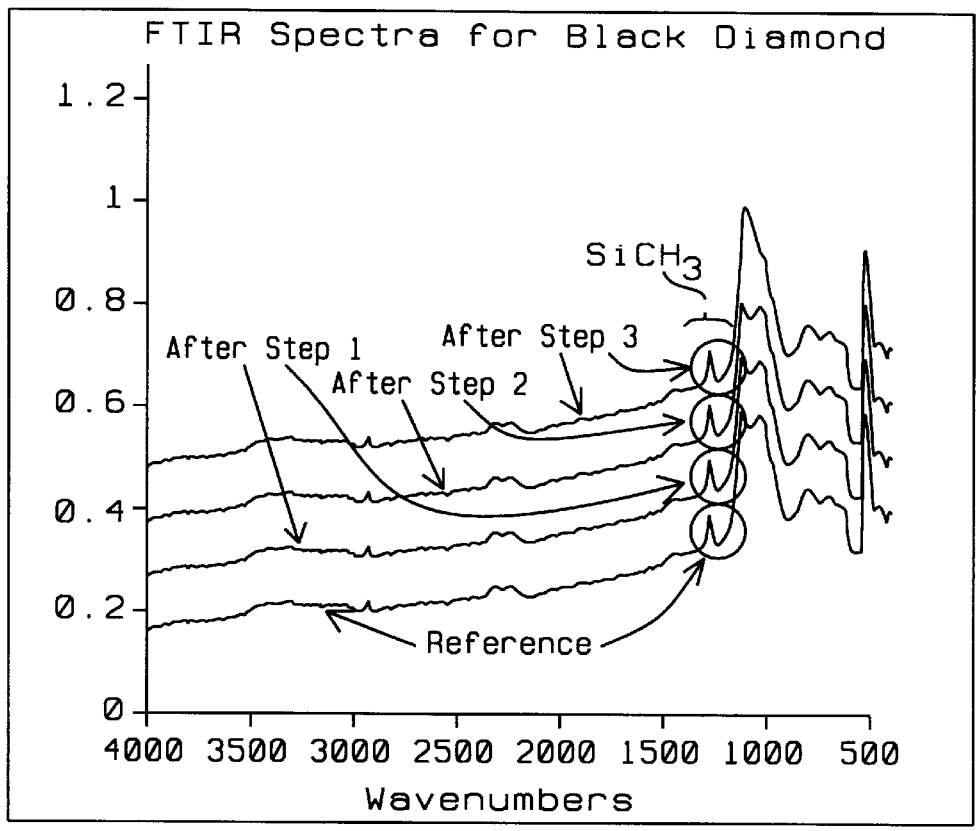
FIG. 6 is a series of aligned FTIR spectographs of a low-k material during each step of the present invention.

Greater than 95% intensity of the methyl-silane bonds (noted as "Si—CH$_3$ at each respective Step) within a blanket low-k material wafer is retained. Although FIG. 6 is specifically for Black Diamond™ material layer 16, similar results would apply for processing with other low-k materials in accordance with the present invention.

The low temperature Step One photoresist layer 22 ashing avoids damaging the low-k film 16 by maintaining the integrity of the methyl-silane (Si—CH$_3$) bonds within low-k film 16.

Since a low bias power is applied during the Step Two SiN layer portion 20 etch, the vertical profile is maintained and copper sputtering is minimized onto opening 18. The minimal copper sputtering also facilitates the Step Three cleaning process.

Since a fully dry cleaning process, Step Three, is used instead of a wet clean process, there are no solvent molecules to be trapped within the pores of porous low-k layer 16 to outgas during the metallization process.

The via chain resistance (Rc) of the fully dry clean process of the present invention and the via chain resistance of the conventional wet clean process have shown to be comparable, i.e. they have similar electrical performance.

While particular embodiments of the present invention have been illustrated and described, it is not intended to limit the invention, except as defined by the following claims.

We claim:

1. A method of cleaning a dielectric material etched opening, comprising the steps of:

providing a semiconductor structure having an exposed device therein;

forming an etch stop layer over said semiconductor structure and said exposed device;

forming a layer of dielectric material over said etch stop layer semiconductor structure and device;

forming a patterned layer of photoresist over said dielectric material layer;

using said patterned photoresist layer as a mask to etch said dielectric material layer to form an opening exposing at least a portion of said etch stop layer over said device;

removing said patterned photoresist layer by a low temperature ashing process at a temperature from about 23 to 27° C.;

removing said exposed portion of said etch stop layer over said device to expose the underlying device by a low pressure, low bias etching process at a pressure from about 8 to 12 milli-Torr and a bias power from about 25 to 35 W; and cleaning said exposed underlying device and said opening-by removing any remaining low pressure, low bias etch polymer and etch residue by a fully dry cleaning process using an $H_2$ and He gas.

2. The method of claim 1, wherein said etch stop layer is from about 450 to 550 Å thick, said dielectric material layer is from about 10,000 to 11,000 Å thick.

3. The method of claim 1, wherein said low temperature photoresist layer ashing step is conducted insitu, and the ratio of the number of methyl-silane bonds in said dielectric material layer after said fully dry cleaning process step, to the number of methyl-silane bonds in said dielectric material layer as formed, is about 90%.

4. The method of claim 1, wherein said low temperature photoresist layer ashing step, said etch stop layer portion low bias etching step, and said fully dry cleaning process step are conducted within an inductive coupled plasma tool.

5. The method of claim 1, wherein said low temperature photoresist layer ashing step is further conducted at a temperature at about 25° C., a pressure from about 8 to 12 milli-Torr, an inductive coupled plasma power of from about 450 to 550 Watts, a bias power from about 80 to 120 Watts, an $O_2$ gas flow from about 25 to 35 sccm, and for from about 80 to 100 seconds.

6. The method of claim 1, wherein said low temperature photoresist layer ashing step is further conducted at a temperature at about 25° C., a pressure at about 10 milli-Torr, an inductive coupled plasma power of about 500 Watts, a bias power at about 100 Watts, an $O_2$ gas flow from about 30 sccm, and for from about 90 seconds.

7. The method of claim 1, wherein said etch stop layer portion low bias etching step is further conducted at a temperature at about 25° C., an inductive coupled plasma power of from about 450 to 550 Watts, an $O_2$ gas flow from about 8 to 12 sccm, an $C_2F_6$ gas flow from about 45 to 55 sccm, and for from about 80 to 100 seconds.

8. The method of claim 1, wherein said etch stop layer portion low bias etching step is further conducted at a temperature at about 25° C., an inductive coupled plasma power of about 500 Watts, an $O_2$ gas flow of about 10 sccm, an $C_2F_6$ gas flow of about 50 sccm, and for about 90 seconds.

9. The method of claim 1, wherein said fully dry cleaning process step is further conducted at a temperature at about 25° C., a pressure from about 16 to 24 milli-Torr, an inductive coupled plasma power of from about 450 to 550 Watts, a bias power from about 45 to 55 Watts, an $H_2$ and He gas flow from about 70 to 80 sccm having an $H_2$: He ratio of from about 1:10 to 1:11, and for from about 25 to 35 seconds.

10. The method of claim 1, wherein said fully dry cleaning process step is further conducted at a temperature from about 25° C., a pressure of about 20 milli-Torr, an inductive coupled plasma power of about 500 Watts, a bias power of about 50 Watts, an $H_2$ and He gas flow of about 75 sccm having an $H_2$: He ratio of about 1:10, and for from about 30 seconds.

11. The method of claim 1, wherein:
said low temperature photoresist layer ashing step is further conducted at a temperature of about 25° C., a pressure from about 8 to 12 milli-Torr, an inductive coupled plasma power of from about 450 to 550 Watts, a bias power from about 80 to 120 Watts, an $O_2$ gas flow from about 25 to 35 sccm, and for from about 80 to 100 seconds;
said etch stop layer portion low bias etching step is further conducted at a temperature from about 23 to 27° C., an inductive coupled plasma power of from about 450 to 550 Watts, an $O_2$ gas flow from about 8 to 12 sccm, an $C_2F_6$ gas flow from about 45 to 55 sccm, and for from about 80 to 100 seconds; and
said fully dry cleaning process step is further conducted at a temperature from about 23 to 27° C., a pressure from about 16 to 24 milli-Torr, an inductive coupled plasma power of from about 450 to 550 Watts, a bias power from about 45 to 55 Watts, an $H_2$ and He gas flow from about 70 to 80 sccm having an $H_2$: He ratio of from about 1:10 to 1:11, and for from about 25 to 35 seconds.

12. The method of claim 1, wherein:
said low temperature photoresist layer ashing step is further conducted at a temperature at about 25° C., a pressure at about 10 milli-Torr, an inductive coupled plasma power of about 500 Watts, a bias power at about 100 Watts, an $O_2$ gas flow from about 30 sccm, and for from about 90 seconds;
said etch stop layer portion low bias etching step is further conducted at a temperature at about at about 25° C., an inductive coupled plasma power of about 500 Watts, an $O_2$ gas flow of-about 10 sccm, an $C_2F_6$ gas flow of about 50 sccm, and for about 90 seconds; and
said fully dry cleaning process step is further conducted at a temperature at about 25° C., a pressure of about 20 milli-Torr, an inductive coupled plasma power of about 500 Watts, a bias power of about 50 Watts, an $H_2$ and He gas flow of about 75 sccm having an $H_2$: He ratio of about 1:10, and for about 30 seconds.

13. A method of cleaning a dielectric material etched opening, comprising the steps of:
providing a semiconductor structure having an exposed device therein;
forming an etch stop layer over said semiconductor structure and said exposed device;
forming a layer of dielectric material over said etch stop layer semiconductor structure and device;
forming a patterned layer of photoresist over said dielectric material layer;
using said patterned photoresist layer as a mask to etch said dielectric material layer to form an opening exposing at least a portion of said etch stop layer over said device;
removing said patterned photoresist layer by an insitu low temperature ashing process at a temperature from about 23 to 27° C.;
removing said exposed portion of said etch stop layer over said device to expose the underlying device by a low pressure, low bias etching process at a pressure from about 8 to 12 milli-Torr and a bias power from about 25 to 35 W;
cleaning said exposed underlying device and said opening by removing any remaining low pressure, low bias etch polymer and etch residue by a fully dry cleaning process using an $H_2$ and He gas; and
wherein said low temperature photoresist layer ashing step, said etch stop layer portion low bias etching step, and said fully dry cleaning process step are conducted within an inductive plasma tool.

14. The method of claim 13, wherein said etch stop layer is from about 450 to 550 Å thick, said dielectric material layer is from about 8,000 to 12,000 Å thick.

15. The method of claim 13, wherein said low temperature photoresist layer ashing step is further conducted at a temperature at about 25° C., a pressure from about 8 to 12 milli-Torr, an inductive coupled plasma power of from about 450 to 550 Watts, a bias power from about 80 to 120 Watts, an $O_2$ gas flow from about 25 to 35 sccm, and for from about 80 to 100 seconds.

16. The method of claim 13, wherein said low temperature photoresist layer ashing step is further conducted at a temperature at about 25° C., a pressure at about 10 milli-Torr, an inductive coupled plasma power of about 500 Watts, a bias power at about 100 Watts, an $O_2$ gas flow from about 30 sccm, and for from about 90 seconds.

17. The method of claim 13, wherein said etch stop layer portion low bias etching step is further conducted at a temperature of about 25° C., an inductive coupled plasma power of from about 450 to 550 Watts, an $O_2$ gas flow from about 8 to 12 sccm, an $C_2F_6$ gas flow from about 45 to 55 sccm, and for from about 80 to 100 seconds.

18. The method of claim 13, wherein said etch stop layer portion low bias etching step is further conducted at a temperature of about 25° C., an inductive coupled plasma power of about 500 Watts, an $O_2$ gas flow of about 10 sccm, an $C_2F_6$ gas flow of about 50 sccm, and for about 90 seconds.

19. The method of claim 13, wherein said fully dry cleaning process step is further conducted at a temperature at about 25° C., a pressure from about 16 to 24 milli-Torr, an inductive coupled plasma power of from about 450 to 550 Watts, a bias power from about 45 to 55 Watts, an $H_2$ and He gas flow from about 70 to 80 sccm having an $H_2$: He ratio of from about 1:10 to 1:11, and for from about 25 to 35 seconds.

20. The method of claim 13, wherein said fully dry cleaning process step is further conducted at a temperature at about 25° C., a pressure of about 20 milli-Torr, an inductive coupled plasma power of about 500 Watts, a bias power of about 50 Watts, an $H_2$ and: He gas flow of about 75 sccm having an $H_2$ : He ratio of about 1:10, and for from about 30 seconds.

21. The method of claim 13, wherein:
said low temperature photoresist layer ashing step is further conducted at a temperature at about 25° C., a pressure from about 8 to 12 milli-Torr, an inductive coupled plasma power of from about 450 to 550 Watts, a bias power from about 80 to 120 Watts, an $O_2$ gas flow from about 25 to 35 sccm, and for from about 80 to 100 seconds;
said etch stop layer portion low bias etching step is further conducted at a temperature at about 25° C., an inductive coupled plasma power of from about 450 to 550 Watts, an $O_2$ gas flow from about 8 to 12 sccm, an $C_2F_6$ gas flow from about 45 to 55 sccm, and for from about 80 to 100 seconds;
said fully dry cleaning process step is further conducted at a temperature at about 25° C., a pressure from about 16 to 24 milli-Torr, an inductive coupled plasma power of from about 450 to 550 Watts, a bias power from about 45 to 55 Watts, an $H_2$ and He gas flow from about 70 to 80 sccm having an $H_2$: He ratio of from about 1:10 to 1:11, and for from about 25 to 35 seconds; and the ratio of the number of methyl-silane bonds in said dielectric material layer after said fully dry cleaning process step, to the number of methyl-silane bonds in said dielectric material layer as formed, is about 90%.

22. The method of claim 13, wherein:

said low temperature photoresist layer ashing step is further conducted at a temperature at about 25° C., a pressure at about 10 milli-Torr, an inductive coupled plasma power of about 500 Watts, a bias power at about 100 Watts, an $O_2$ gas flow from about 30 sccm, and for from about 90 seconds;

said etch stop layer portion low bias etching step is further conducted at a temperature at about 25° C., an inductive coupled plasma power of about 500 Watts, an $O_2$ gas flow of about 10 sccm, an $C_2F_6$ gas flow of about 50 sccm, and for about 90 seconds; and said fully dry cleaning process step is further conducted at a temperature at about 25° C., a pressure of about 20 milli-Torr, an inductive coupled plasma power of about 500 Watts, a bias power of about 50 Watts, an $H_2$ and He gas-flow of about 75 sccm having an $H_2$: He ratio of about 1:10, and for from about 30 seconds.

23. A method of cleaning a dielectric material etched opening, comprising the steps of:

providing a semiconductor structure having an exposed device therein;

forming an etch stop layer over said semiconductor structure and said exposed device;

forming a layer of dielectric material over said etch stop layer semiconductor structure and device;

forming a patterned layer of photoresist over said dielectric material layer;

using said patterned photoresist layer as a mask to etch said dielectric material layer to form an opening exposing at least a portion of said etch stop layer over said device;

removing said patterned photoresist layer by a low temperature ashing process at a temperature from about 23 to 27° C., a pressure from about 8 to 12 milli-Torr, an inductive coupled plasma power of from about 450 to 550 Watts, a bias power from about 80 to 120 Watts, an $O_2$ gas flow from about 25 to 35 sccm, and for from about 80 to 100 seconds;

removing said exposed portion of said etch stop layer over said device to expose the underlying device by a low pressure, low bias etching process at a pressure from about 8 to 12 milli-Torr, a bias power from about 25 to 35 W, a temperature from about 23 to 27° C., an inductive coupled plasma power of from about 450 to 550 Watts, an $O_2$ gas flow from about 8 to 12 sccm, an $C_2F_6$ gas flow from about 45 to 55 sccm, and for from about 80 to 100 seconds; and cleaning said exposed underlying device and said opening by removing any remaining low pressure, low bias etch polymer and etch residue by a fully dry cleaning process using an $H_2$ and He gas at a temperature from, about 23 to 27° C., a pressure from about 16 to 24 milli-Torr, an inductive coupled plasma power of from about 450 to 550 Watts, a bias power from about 45 to 55 Watts, an $H_2$ and He gas flow from about 70 to 80 sccm having an. $H_2$: He ratio of from about 1:10 to 1.11, and for from about 25 to 35 seconds.

24. The method of claim 23, wherein said etch stop layer is from about 450 to 550 Å thick, said dielectric material layer is from about 8,000 to 12,000 Å thick.

25. The method of claim 23, wherein said low temperature photoresist layer ashing step is conducted insitu.

26. The method of claim 23, wherein said low temperature photoresist layer ashing step, said etch stop layer portion low bias etching step, and said fully dry cleaning process step are conducted within an inductive coupled plasma tool.

27. The method of claim 23, wherein said low temperature photoresist layer ashing step is further conducted at a temperature at about 25° C., a pressure at about 10 milli-Torr, an inductive coupled plasma power of about 500 Watts, a bias power at about 100 Watts, an $O_2$ gas flow from about 30 sccm, and for from about 90 seconds.

28. The method of claim 23, wherein said etch stop layer portion low bias etching step is further conducted at a temperature at about 25° C., an inductive coupled plasma power of about 500 Watts, an $O_2$ gas flow of about 10 sccm, an $C_2F_6$ gas flow of about 50 sccm, and for about 90 seconds.

29. The method of claim 23, wherein said fully dry cleaning process step is further conducted at a temperature at about 25° C., a pressure of about 20 milli-Torr, an inductive coupled plasma power of about 500 Watts, a bias power of about 50 Watts, an $H_2$ and He gas flow of about 75 sccm having an $H_2$: He ratio of about 1:10, and for from about 30 seconds.

30. The method of claim 23, wherein the ratio of the number of methyl-silane bonds in said dielectric material layer after said fully dry cleaning process step, to the number of methyl-silane bonds in said dielectric material layer as formed, is about 80%.

31. The method of claim 23, wherein the ratio of the number of methyl-silane bonds in said dielectric material layer after said fully dry cleaning process step, to the number of methyl-silane bonds in said dielectric material layer as formed, is about 95%.

* * * * *